(12) United States Patent
Hieda et al.

(10) Patent No.: US 7,413,987 B2
(45) Date of Patent: *Aug. 19, 2008

(54) METHOD FOR MANUFACTURING A SEMICONDUCTOR DEVICE

(75) Inventors: Katsuhiko Hieda, Yokohama (JP);
Atsuko Kawasaki, Yokohama (JP);
Masahiro Kiyotoshi, Sagamihara (JP);
Katsuhiko Tachibana, Yokohama (JP);
Soichi Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

This patent is subject to a terminal disclaimer.

(21) Appl. No.: 11/431,076

(22) Filed: May 10, 2006

(65) Prior Publication Data
US 2006/0205233 A1    Sep. 14, 2006

Related U.S. Application Data

(63) Continuation of application No. 10/674,382, filed on Oct. 1, 2003, now Pat. No. 7,071,107.

(30) Foreign Application Priority Data

Oct. 2, 2002    (JP) .............................. 2002-289428
Jun. 9, 2003    (JP) .............................. 2003-163857

(51) Int. Cl.
*H02L 21/302*    (2006.01)
(52) U.S. Cl. ...................... 438/691; 438/692; 438/696; 438/697; 438/700
(58) Field of Classification Search ................. 438/691, 438/692, 696, 697, 700
See application file for complete search history.

(56) References Cited

U.S. PATENT DOCUMENTS 6,191,002 B1 *   2/2001   Koyanagi .................... 438/431

(Continued)

FOREIGN PATENT DOCUMENTS

JP           05-119307           5/1993

(Continued)

OTHER PUBLICATIONS

Heo et al., "Void Free and Low Stress Shallow Trench Isolation Technology Using P-SOG For Sub 0.1 μm Device", 2002 Symposium On VLSI Technology Digest of Technical Papers, pp. 132-133, 2002.

(Continued)

*Primary Examiner*—Binh X Tran
(74) *Attorney, Agent, or Firm*—Finnegan, Henderson, Farabow, Garrett & Dunner, L.L.P.

(57) ABSTRACT

There is disclosed a method of manufacturing a semiconductor device, wherein an $Si_3N_4$ film is formed as a mask member on the surface of a silicon substrate, then etched to form an STI trench. A solution of perhydrogenated silazane polymer is coated on the surface of the silicon substrate having an STI trench formed thereon to deposit a coated film (PSZ film) thereon. The PSZ film deposited on the mask member is removed, leaving part of the PSZ film inside the trench, wherein the thickness of the PSZ film is controlled to make the height thereof from the bottom of the STI trench become 600 nm or less. Thereafter, the PSZ film is heat-treated in a water vapor-containing atmosphere to convert the PSZ film into a silicon oxide film through a chemical reaction of the PSZ film. Subsequently, the silicon oxide film is heat-treated to densify the silicon oxide film.

19 Claims, 8 Drawing Sheets

U.S. PATENT DOCUMENTS

| | | |
|---|---|---|
| 6,489,252 B2 | 12/2002 | Goo et al. |
| 6,713,365 B2 | 3/2004 | Lin et al. |
| 7,071,107 B2 * | 7/2006 | Hieda et al. .................. 438/691 |

FOREIGN PATENT DOCUMENTS

| | | |
|---|---|---|
| JP | 05-121572 | 5/1993 |
| JP | 09-134917 | 5/1997 |
| JP | 09-321132 | 12/1997 |
| JP | 11-163120 | 6/1999 |
| JP | 11-307626 | 11/1999 |
| JP | 2001-308090 | 11/2001 |
| JP | 2004-179614 | 6/2004 |
| KR | 354441 | 9/2002 |
| WO | WO 98/21750 | 5/1998 |

OTHER PUBLICATIONS

Notification for Filing Opinion mailed Nov. 8, 2005, issued by the Korean Patent Office in counterpart Korean Application No. 10-2003-68155 and English translation thereof.

Document entitled "Partial Translations of IDS Documents," containing translations of each of JP 11-307626, JP 05-121572, JP 05-119307, JP 09-134917, JP 11-163120, JP 09-321132, and JP 2001-309090; 13 pages.

Notification of Reasons for Rejection mailed Sep. 18, 2007 in corresponding Japanese Patent Application No. 2007-213788, and its English Translation.

* cited by examiner

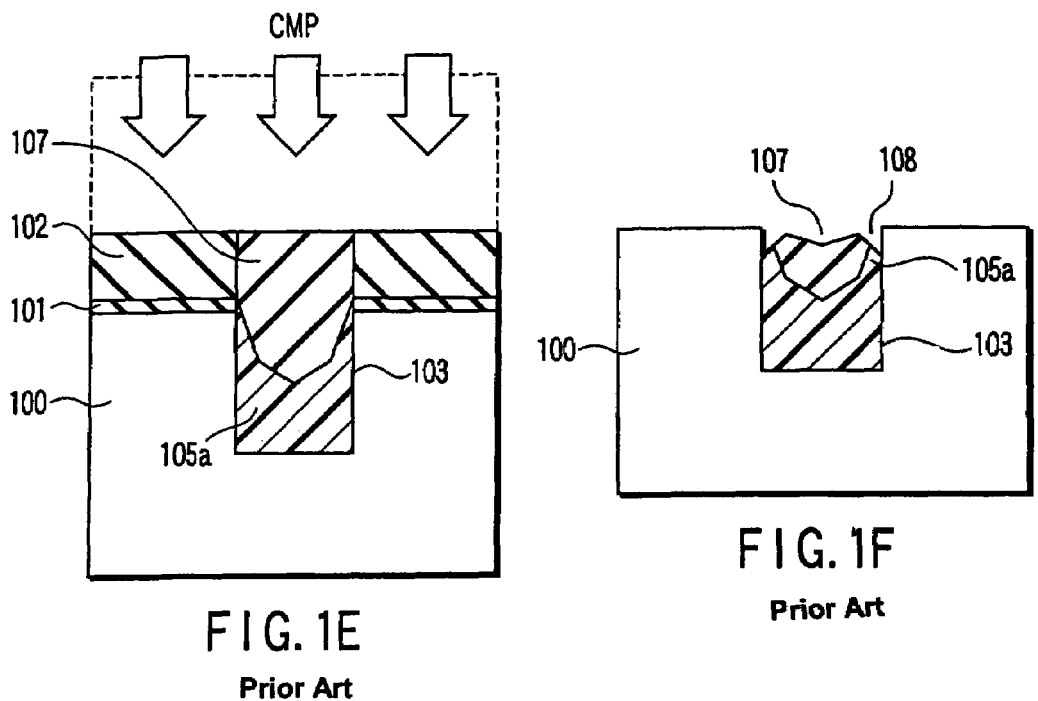
FIG. 1E
Prior Art
FIG. 1F
Prior Art
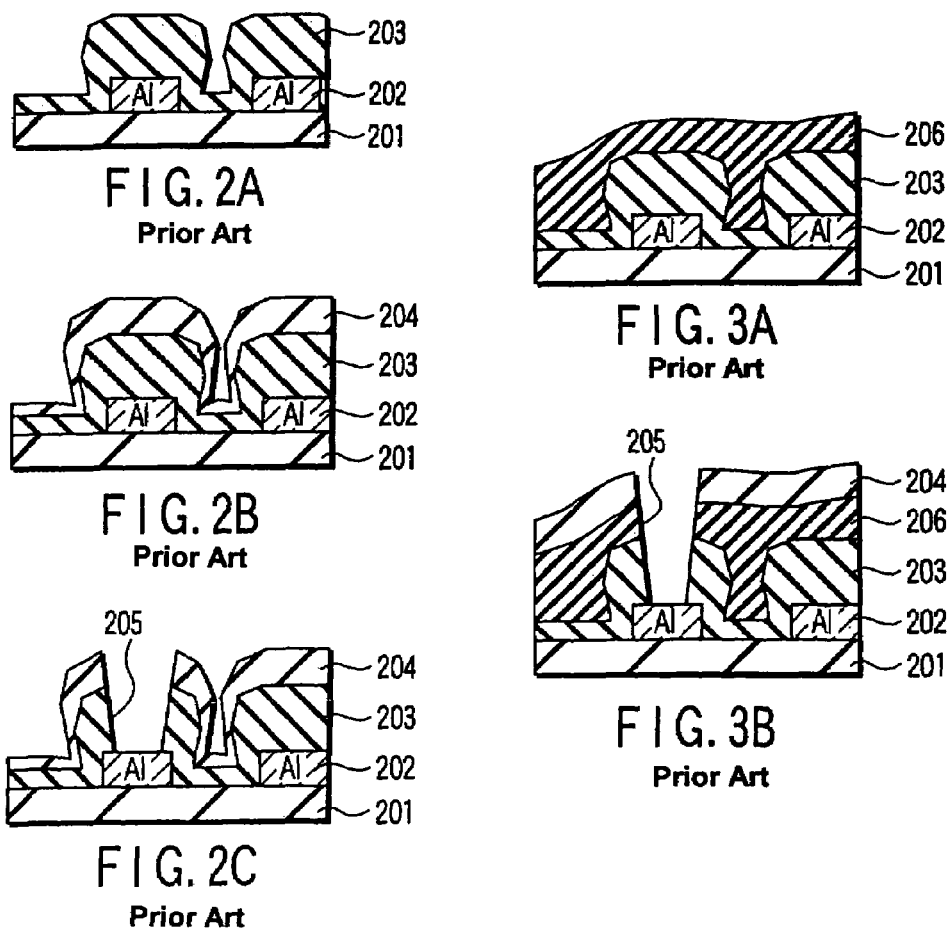
FIG. 2A Prior Art
FIG. 2B Prior Art
FIG. 2C Prior Art
FIG. 3A Prior Art
FIG. 3B Prior Art

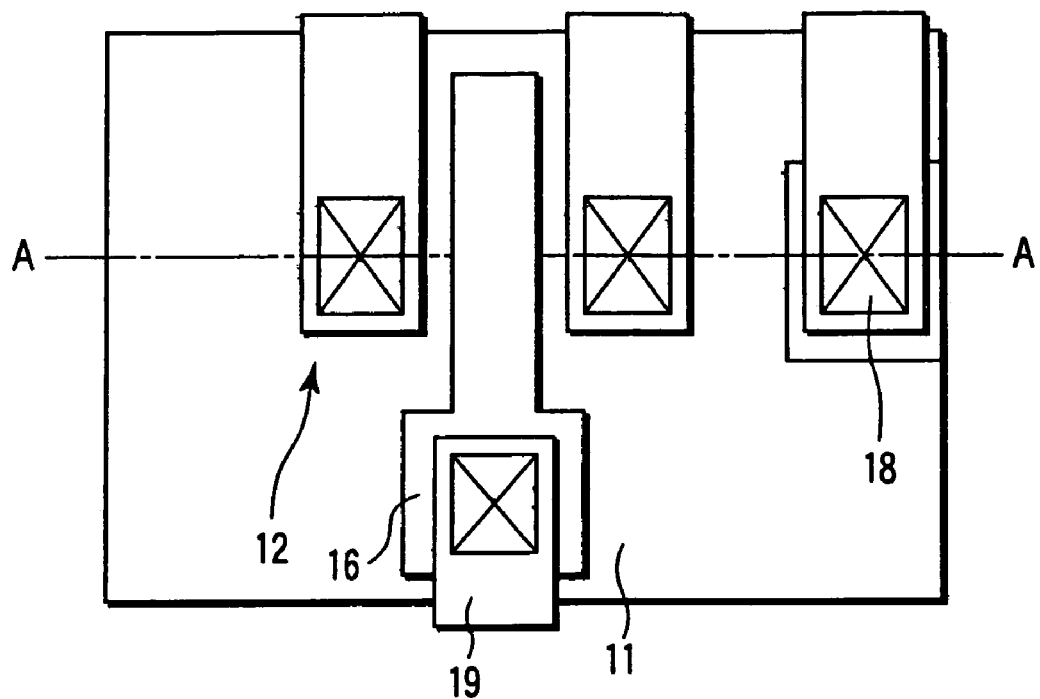
F I G. 4
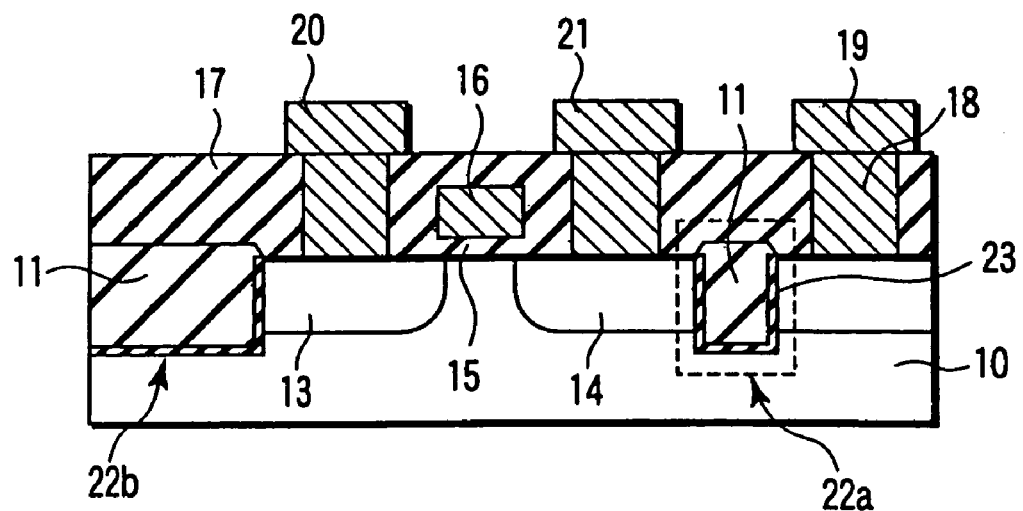
F I G. 5

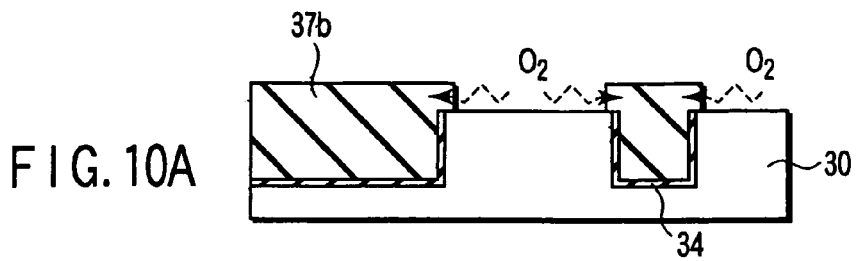
FIG. 10A
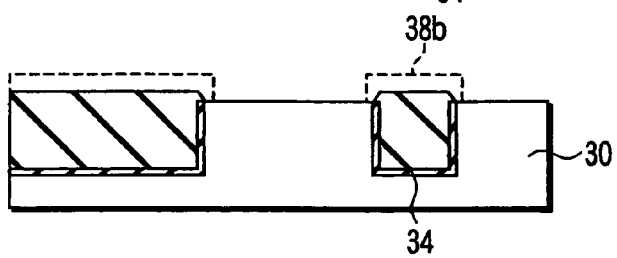
FIG. 10B
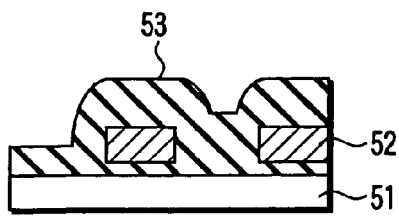
FIG. 11A
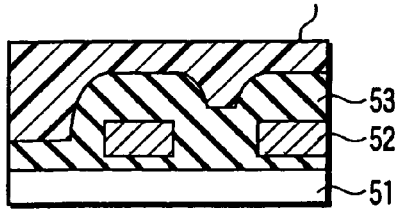
FIG. 11B
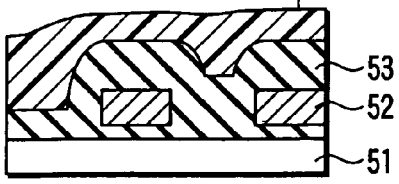
FIG. 11C
FIG. 11D
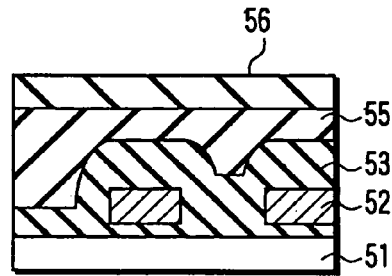
FIG. 11E
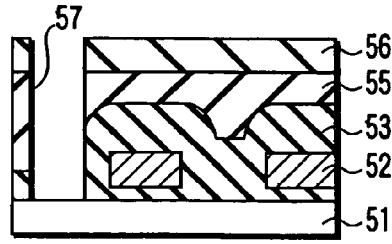
FIG. 11F
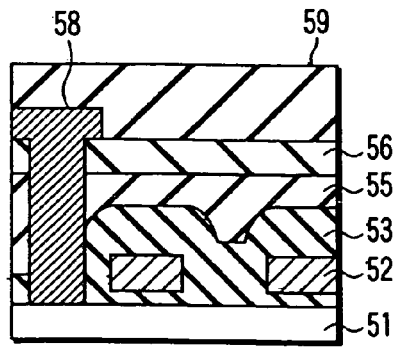
FIG. 11G

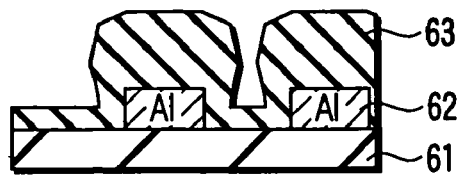
F I G. 12A
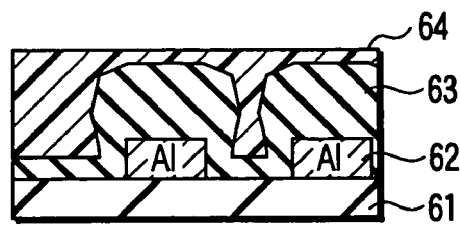
F I G. 12B
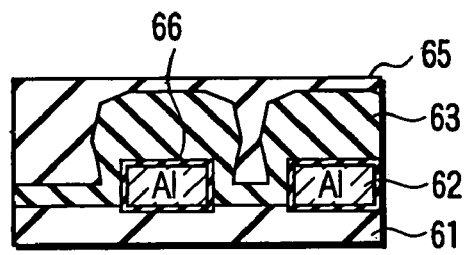
F I G. 12C
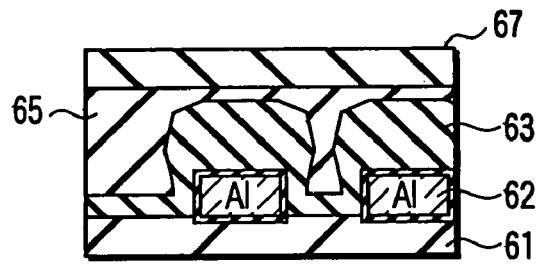
F I G. 12D
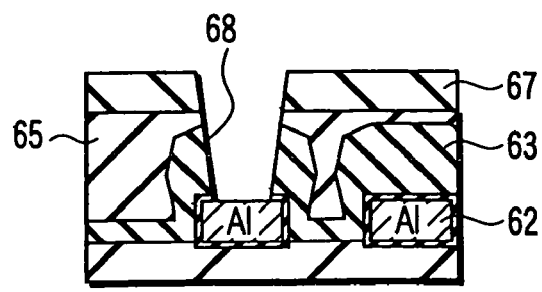
F I G. 12E

METHOD FOR MANUFACTURING A SEMICONDUCTOR DEVICE

CROSS-REFERENCE TO RELATED APPLICATIONS

This is a continuation of application Ser. No. 10/674,382, filed Oct. 1, 2003, now U.S. Pat. No. 7,071,107, which is incorporated in its entirety by reference. This application is also based upon and claims priority from prior Japanese Patent Applications No. 2002-289428, filed Oct. 2, 2002; and No. 2003-163857, filed Jun. 9, 2003, the entire contents of both of which are incorporated herein by reference.

BACKGROUND OF THE INVENTION

1. Field of the Invention

This invention relates to a method for manufacturing a semiconductor device, and in particular, to a method of forming an STI (Shallow Trench Isolation) structure, to a method of forming a PMD (Pre-metal Dielectrics) film, and to a method of forming a passivation film.

2. Description of the Related Art

The STI structure is extensively employed for the isolation of elements in recent semiconductor devices. This STI structure can be formed by a method wherein a trench is formed in an element isolation region of a semiconductor substrate, and then, for example, a silicon oxide ($SiO_2$) film functioning as an element isolating insulation film is buried inside this trench. Concomitant with advancement in fineness of semiconductor elements in semiconductor devices, the aspect ratio of the trench inevitably becomes larger, so that it is now becoming increasingly difficult to bury the conventional ozone ($O_3$)-TEOS CVD-$SiO_2$ film or HDP-TEOS CVD-$SiO_2$ film in the trench of STI structure without inviting the generation of voids or seam.

Therefore, in the manufacture of a semiconductor device where the fineness of semiconductor elements is in the order of 100 nm or less, there has been proposed a method wherein a coating type solution is employed for burying an element isolating insulating film in the STI trench.

This method will be explained with reference to FIGS. 1A to 1F. First of all, as shown in FIG. 1, an $SiO_2$ film 101 is deposited on the surface of a silicon substrate 100, and then an $Si_3N_4$ film 102 functioning as a mask member is laminated on the $SiO_2$ film 101. Subsequently, by using the ordinary exposure technique and dry etching technique by RIE (Reactive Ion Etching) method, the $Si_3N_4$ film 102, the $SiO_2$ film 101 and the silicon substrate 100 are successively worked to form an STI trench 103 for forming STI element isolation in the silicon substrate 100. In this case, the size of the STI trench 103 is: about 100 nm in width and about 300 nm in depth for instance.

Next, as shown in FIG. 1B, in order to enable the STI trench 103 to be completely buried, a solution of silazane perhydride polymer $((SiH_2NH)_n)$ is coated all over the surface of the $Si_3N_4$ film 102 to a thickness of about 600 nm by spin coating method for instance. Then, this coated film is subjected to baking treatment for about 3 minutes at a temperature of not higher than 200° C., for example about 150° C., to allow the solvent to evaporate, thus forming polysilazane (hereinafter referred to as PSZ) film 105.

This PSZ film 105 is then subjected to heat treatment for 60 minutes in an atmosphere containing water vapor at a temperature ranging from about 350° C. to 600° C. to convert this PSZ film 105 into an $SiO_2$ film 106 as shown in FIG. 1C.

Thereafter, as shown in FIG. 1D, the $SiO_2$ film 106 is subjected to heat treatment for about 30 minutes in an oxidizing atmosphere or in an inert atmosphere such as nitrogen gas atmosphere at a temperature of 900° C. or so. As a result, $NH_3$ and $H_2O$ both left remained in the $SiO_2$ film 106 are released therefrom, thus obtaining a high-density $SiO_2$ film 107 which is higher in density than the $SiO_2$ film 106.

Then, the $SiO_2$ film 107 formed on the $Si_3N_4$ film 102 is selectively removed by CMP (Chemical Mechanical Polishing) method for instance to permit the surface of the $Si_3N_4$ film 102 to expose as shown in FIG. 1E. As a result, the $SiO_2$ film 107 is formed inside each of the STI trenches 103 with only the surface of the $SiO_2$ film 107 being exposed.

Further, the $Si_3N_4$ film 102 and the $SiO_2$ film 101 are successively removed so as to permit the surface of the silicon substrate 100 to expose as shown in FIG. 1F. As a result, the STI structure where the $SiO_2$ film 107 is buried inside the STI trench 103 is formed.

According to the aforementioned method, the PSZ film 105 existing inside the STI trench having a trench width of 1 μm or more can be sufficiently converted into the $SiO_2$ film 107 in subsequent steps. In the case of the STI trench 103 where the trench width thereof is as narrow as about 100 nm or less however, part of the PSZ film 105a existing inside the trench cannot be sufficiently converted into $SiO_2$ as shown in FIG. 1E, thereby generating an insufficiently-converted PSZ region 105a. Since this insufficiently-converted PSZ region 105a can be wet-etched at a high etching rate, it is difficult to inhibit the generation of a divot 108 particularly at each corner portion of the STI structure. Moreover, it is also difficult to control the height of the insulating film of the STI structure and therefore it has been difficult to realize an STI structure having a desired configuration.

The reason for this can be ascribed to the fact that in the case of the PSZ film 105 formed inside the STI trench 103 where the trench width thereof is as narrow as about 100 nm or less, it is difficult, as shown in FIG. 1C, to supply the PSZ region 105a located close to the bottom of the trench with a sufficient quantity of $H_2O$ and oxygen ($O_2$) for enabling the PSZ region 105a to convert into the $SiO_2$ film 106.

Therefore, there have been persistent demands for the development of a manufacturing method which makes it possible to uniformly convert the PSZ film existing inside the STI trench into an $SiO_2$ film irrespective of the size of the STI trench width, i.e. not only an STI trench having a relatively wide trench width but also an STI trench having a narrow trench width of the order of 100 nm.

In the meantime, as for the materials for a PMD film, although P-TEOS $SiO_2$ has been conventionally employed, the PMD film is required to have the following characteristics. Namely, the PMD film is capable of flattening step portions formed on an underlying layer such as gate electrodes, and this flattening by the PMD film can be performed at a low temperature of 600° C. or less. Further, the wet etching rate of the PMD film is as close as possible to that of thermally oxidized film. Namely, the purpose of this is to prevent the generation of a step portion which may be caused to occur on the occasion of permitting the surface of Si substrate to expose in a step of forming a contact due to abnormal etching of the sidewall of the contact in a wet etching treatment.

As promising material for low temperature PMD, a coating type film such as SOG can be employed. A coated film of SOG can be formed by a coating method over a stepped surface of a gate electrode with an interlayer insulating film such as an $SiO_2$ film or an $Si_3N_4$ film being interposed therebetween. Although it is possible with the employment of this coating type film to obtain a flat film over an underlying surface region where the step portions are densely formed, it is impossible to obtain a flat film over an underlying surface region where the step portions are dispersedly formed. Furthermore, the conventional SOG film is defective in that a considerable degree of volumetric shrinkage of film is caused to occur on the occasion of removing the solvent contained in the SOG, thereby raising a problem that the SOG film is caused to crack at a region thereof where the coating of SOG film is relatively large in thickness. Additionally, even if this SOG film is converted into an $SiO_2$ film through the heat treatment thereof, the wet etching rate of the converted $SiO_2$ film is not less than twice as large as that of the thermally oxidized film. As a result, there is a problem that a step portion is caused to generate on the sidewall of the contact on the occasion of wet etching.

With respect to the formation of a passivation film, it has been difficult to realize an $SiO_2$ film which is excellent in coverage and is free from plasma damage. Next, a passivation film of a 2-ply structure consisting of a P-TEOS $SiO_2$ film and a P—SiN film that has been conventionally employed will be explained with reference to FIGS. 2A to 2C. First of all, as shown in FIG. 2A, a plasma (P) $SiO_2$ film 203 is deposited on the surface of an interlayer insulating film 201 provided with a wiring 202 by HDP for instance. Due to poor coverage, the P—$SiO_2$ film 203 is deposited relatively thick over the wiring 202 and relatively thin over the region located between wirings. Moreover, since the P—$SiO_2$ film 203 is relatively high in moisture permeability, a P—SiN film 204 which is low in moisture permeability is deposited on the surface of the P—$SiO_2$ film 203 as shown in FIG. 2B. Since this P—SiN film 204 is also poor in coverage, this P—SiN film 204 is deposited relatively thick over the wiring 202 as shown in FIG. 2B. Since this P—SiN film 204 is required to be deposited to a thickness of at least 100 nm in order to ensure low moisture permeability, the film thickness of this P—SiN film 204 over the wiring 202 becomes relatively large. As a result, as shown in FIG. 2C, the film thickness of the region where via-hole 205 is to be formed becomes relatively large, thereby making it difficult to form the via-hole 205 without increasing the aspect ratio.

In the case of the conventional SOG (Spin on Glass) also, it is required to make the film thickness thereof relatively large in order to level out the step portions originating from the wiring layer 202. As a result, as shown in FIG. 3B, there is a problem that the aspect ratio of the via-hole 205 becomes relatively large.

As explained above, the conventional methods are accompanied with problems that a divot is caused to generate in the width of STI trench of not more than 100 nm or so, and that due to the fluctuation in burying height of insulating material depending on the width of the STI trench, it has been difficult to realize a desirable STI structure. Further, in the case of the PMD film, it is difficult to concurrently achieve not only the flattening of the surface thereof at low temperatures but also a wet etching rate thereof which is almost identical with that of the oxide film.

With respect to the formation of a passivation film also, no one has yet to realize an $SiO_2$ film which is excellent in step coverage and is free from plasma damage.

BRIEF SUMMARY OF THE INVENTION

A method of manufacturing a semiconductor device according to one embodiment of the present invention comprises:

forming an element isolation trench in a semiconductor substrate by using a mask member;

forming a first film on the semiconductor substrate by a coating method to fill the element isolation trench with the first film;

evaporating a solvent contained in the first film to convert the first film into a second film;

removing part of the second film which is deposited on the mask member by CMP, thereby permitting a surface of the mask member to expose while selectively leaving behind part of the second film which is buried in the element isolation trench; and subjecting the second film buried in the element isolation trench to burning oxidation treatment in an atmosphere containing water vapor.

A method of manufacturing a semiconductor device according to another embodiment of the present invention comprises:

forming an element isolation trench in a semiconductor substrate by using a mask member;

coating a solution of silazane perhydrogenated polymer on a surface of the semiconductor substrate by a coating method to fill the element isolation trench with a coated film containing the silazane perhydrogenated polymer;

heat-treating the coated film to permit a solvent contained therein to evaporate, thereby converting the coated film into a polysilazane film;

removing the polysilazane film deposited on the mask member by CMP, thereby permitting a surface of the mask member to expose while permitting the polysilazane film to selectively remain inside the element isolation trench; and subjecting the polysilazane film to heat treatment to form a silicon oxide film.

A method of manufacturing a semiconductor device according to another embodiment of the present invention comprises:

peelably forming a dielectric film having a flat surface on a surface of a base film;

forming a step portion on a surface of a semiconductor substrate;

placing the dielectric film on the semiconductor substrate having the step portion and applying heat and pressure to the dielectric film;

peeling the base film from the dielectric film to obtain the semiconductor substrate having the step portion buried with the dielectric film, thus forming a dielectric film having a flat surface; and subjecting the dielectric film to burning oxidation treatment in an atmosphere containing water vapor.

BRIEF DESCRIPTION OF THE SEVERAL VIEWS OF THE DRAWING

FIGS. 1A to 1F show respectively a cross-sectional view illustrating, stepwise, a manufacturing method of conventional semiconductor device;

FIGS. 2A to 2C show respectively a cross-sectional view illustrating, stepwise, a manufacturing method of conventional semiconductor device;

FIGS. 3A and 3B show respectively a cross-sectional view illustrating, stepwise, a manufacturing method of conventional semiconductor device;

FIG. 4 is a plan view an MOS transistor using an STI element isolation structure according to a first embodiment of the present invention;

FIG. 5 is a cross-sectional view taken along the line A-A of FIG. 4 of an MOS transistor using an STI element isolation structure;

FIGS. 10A and 10B show respectively a cross-sectional view illustrating, stepwise, a manufacturing method of a semiconductor device according to a fourth embodiment of the present invention;

FIGS. 11A to 11G show respectively a cross-sectional view illustrating, stepwise, a manufacturing method of a semiconductor device according to a fifth embodiment of the present invention; and FIGS. 12A to 12E show respectively a cross-sectional view illustrating, stepwise, a manufacturing method of a semiconductor device according to a sixth embodiment of the present invention.

DETAILED DESCRIPTION OF THE INVENTION

Figure 1A:
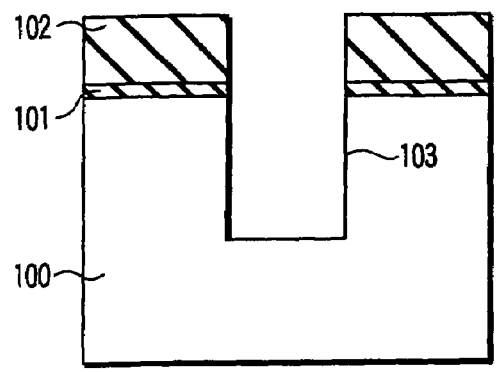
Figure 1B:
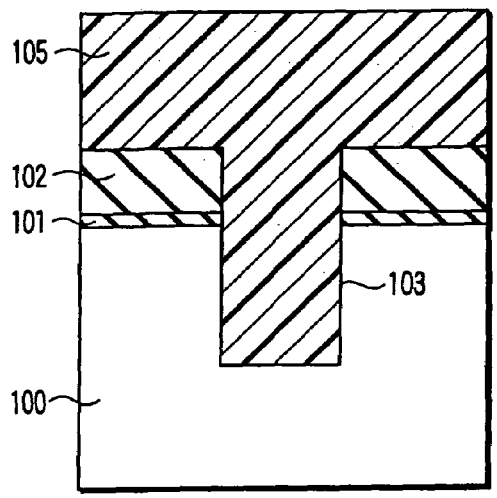
Figure 1C:
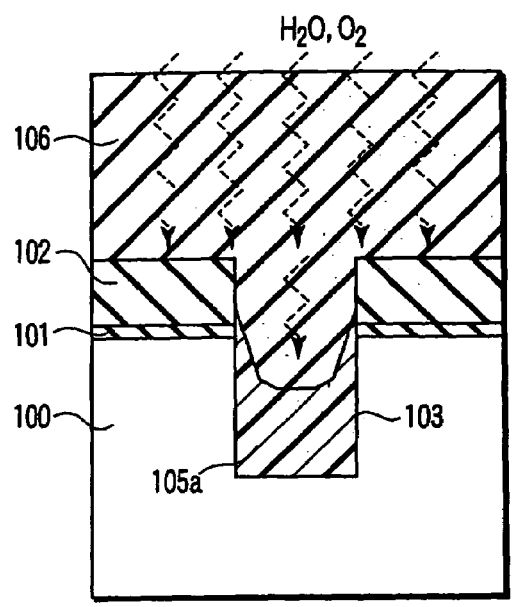
Figure 1D:
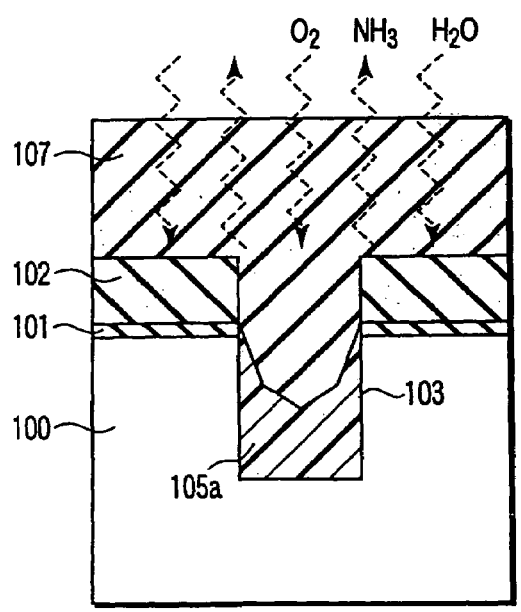

Next, the embodiments of the present invention will be explained as follows with reference with the drawings.

First Embodiment

First of all, a semiconductor device to be manufactured by a method according to a first embodiment of the present invention will be explained with reference to FIGS. 4 and 5. The semiconductor device shown herein is a MOS transistor where an STI element isolation structure is employed, the plan view thereof being shown in FIG. 4. On the other hand, FIG. 5 is a cross-sectional view taken along the line A-A of FIG. 4. In these FIGS. 4 and 5, the wiring layer and passivation layer over the metallic wiring portions are omitted, and in FIG. 4, the interlayer insulating film is omitted.

The MOS transistor according to this embodiment can be manufactured according to the following method, for instance. First of all, an element isolation region 11 having an STI structure is formed in a semiconductor substrate 10 such for example as a silicon substrate in order to electrically isolate semiconductor elements from each other. The element isolation region 11 can be formed with various trench widths and has a STI sidewall oxide film 23 on the side surface thereof. Then, a source region 13 and a drain region 14 are formed in an element-forming region 12, surrounded by the element isolation region, of the silicon substrate 10. A gate electrode 16 is formed at a region between the source/drain regions with a gate oxide film 15 being interposed therebetween. An interlayer insulating film 17 is formed on this gate electrode and selectively opened to form contact holes 18. These contact holes 18 are filled with a conductive material, and then a source electrode 20 and a drain electrode 21 both electrically connected with a metal wiring 19 are formed. Subsequently, a multi-layer wiring, a passivation film and pads are formed to accomplish the manufacture of an MOS transistor.

Next, a method of manufacturing a semiconductor device according to a first embodiment will be explained with reference to FIGS. 6A to 6F. These figure illustrate a narrow STI region 22a having a narrow width of the order of 100 nm or less, which corresponds to the dotted portion shown in FIG. 5. A wide STI region 22b having wide width of the order of more than 100 nm is also shown in FIG. 5.

First of all, a silicon oxide film (hereinafter referred to as $SiO_2$) 31 is deposited on the surface of a semiconductor substrate 30 such, for example, as a silicon substrate, to a thickness of about 4 nm. On the surface of this silicon oxide film 31 is deposited a silicon nitride film (hereinafter referred to as $Si_3N_4$) 32 having a thickness of about 200 nm by an LP-CVD (Low Pressure Chemical Vapor Deposition) method. This $Si_3N_4$ 32 film functions as a mask member. Subsequently, by using a dry etching technique employing an exposure technique, and RIE, the $Si_3N_4$ film 32, the $SiO_2$ film 31 and the silicon substrate 30 are successively worked so as to form an STI trench 33 in the silicon substrate 30, this STI trench 33 functioning as an element isolation trench for isolating the STI elements from each other. The dimension of this STI trench 33 may be about 100 nm in width and about 300 nm in depth. Since this STI trench 33 is designed to isolate the semiconductor elements, a trench of various widths can be formed in the silicon substrate.

Alternatively, an $SiO_2$ film (not shown) may be laminated on the $Si_3N_4$ film for using this $SiO_2$ film as an etching mask member for the silicon substrate 30.

Next, by thermal oxidation method, the silicon substrate 30 is oxidized to form a thermally oxidized film 34 having a film thickness of about 3 nm on the sidewalls of the STI trench 33. If oxygen radicals are employed, it is possible to form a uniform and high quality silicon oxide film on the sidewalls of the STI trench 33, the quality of the silicon oxide film being independent of the plane azimuth of silicon (Si). It is possible, in this oxidation step, to slightly oxidize the sidewalls of the $Si_3N_4$ film 32 in advance by ISSG (In-Situ Stream Generation).

Subsequently, by using so-called pullback method, the trench width of the $Si_3N_4$ film 32 is expanded by about 10 nm. This step can be performed using hot phosphoric acid for example. It is preferable, on this occasion, to employ isotropic etching so as to ensure a high selectivity ratio of 2 or more between the $SiO_2$ film 31 and the $Si_3N_{24}$ film 32.

Figure 6A:
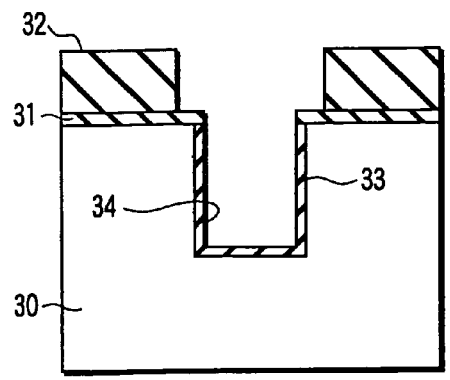
FIGS. 6A to 6F show respectively a cross-sectional view illustrating, stepwise, a manufacturing method of semiconductor device according to a first embodiment of the present invention.
Figure 6B:
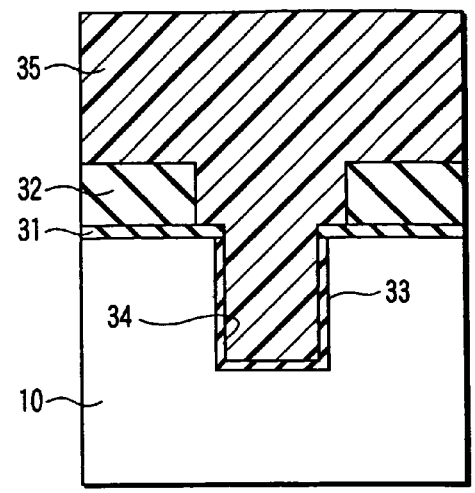

Then, as shown in FIG. 6B, a coating solution is coated all over the surface of this worked $Si_3N_4$ film 32 in such a manner that the STI trench 33 is completely filled with the solution. For example, the coating solution is coated so as to form a coated film having a film thickness of about 600 nm over the $Si_3N_4$ film 32. This coated film can be formed according to the following method, for instance. First of all, a solution of perhydrogenated silazane polymer $((SiH_2NH)_n)$ is coated all over the surface of the $Si_3N_4$ film 32 by spin coating. Then, the resultant coated film is subjected to baking for 3 minutes at a temperature of not higher than 200° C., for example about 150° C. to allow the solvent in the coated film to evaporate, thereby forming a polysilazane (PSZ) film 35.

Since the thickness of the $Si_3N_4$ film 32 is caused to decrease to about 190 nm from the initial deposition thickness of 200 nm, the distance between the surface of the PSZ film 35 and the bottom of the STI trench 33 would become about 1100 nm. It has been confirmed that the burying property of the PSZ film 35 is excellent so that it can be buried in a narrow STI trench 33 having a width of the order of 100 nm without generating voids therein.

Figure 6C:
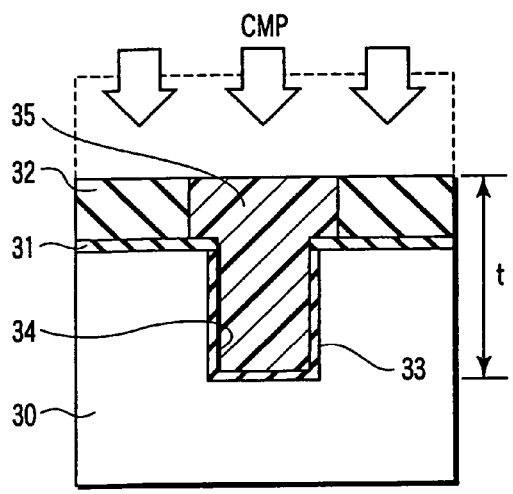

Then, the PSZ film 35 deposited on the surface of the $Si_3N_4$ film 32 is selectively removed by CMP, for instance, to permit the surface of the $Si_3N_4$ film 32 to selectively expose as shown in FIG. 6C. As a result, the PSZ film 35 is left remain inside the STI trench 33 in such a configuration wherein only the top surface of the PSZ film 35 is exposed. This configuration is an important point in this embodiment of the present invention.

Since the PSZ film 35 is weak in mechanical strength, an abrasive material (slurry) which is larger in particle diameter and relatively soft as compared with ordinary abrasive materials is employed in the CMP. Further, it is also desirable to adjust the load to control the polishing rate. As a result of the working by CMP, the distance between the bottom of the STI trench 33 and the PSZ film 35 becomes as short as about 480 nm.

Namely, the distance "t" between the bottom of the STI trench 33 and the top surface of the PSZ film 35 would become one which corresponds to the film thickness of the region over the mask in the conventional method. Alternatively, it may be said that the distance "t" would become one which nearly corresponds to the film thickness of the PSZ film 35 existing at a sufficiently wide STI trench width portion. The PSZ film 35 may be heat-treated for 60 minutes at a temperature ranging from 200° C. to 450° C. in an atmosphere containing water vapor prior to the step of CMP. Owing to this heat treatment, the mechanical strength of the PSZ film 35 against CMP can be enhanced, thus performing the CMP resistance-giving treatment of the PSZ film 35. Incidentally, if a PSZ film having a thickness of 600 nm or more is heat-treated at a temperature exceeding over 500° C., shrinkage of film would be caused and complete conversion into $SiO_2$ would become difficult. Therefore, the temperature of this heat treatment should preferably be within the range of 350° C. to 450° C.

Figure 6D:
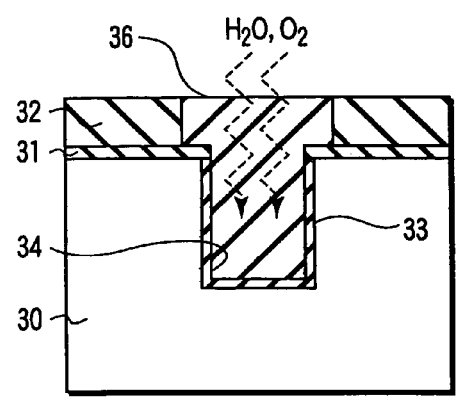

Next, as shown in FIG. 6D, at the stage where the thickness of the PSZ film becomes smaller than 500 nm, the burning oxidation (hereinafter referred to as BOX oxidation) treatment of the PSZ film is performed for 30 minutes at a temperature of 800° C. for example and in an atmosphere of water vapor, thereby completely converting the PSZ film 35 into an $SiO_2$ film 36. The atmosphere of water vapor can be created by concurrently supplying water and oxygen to the reaction atmosphere. The reaction taking place on this occasion can be represented by the following chemical reaction (1).

$$SiH_2NH + 2O \rightarrow SiO_2 + NH_3 \qquad (1)$$

Due to the decomposition of water vapor ($H_2O$), oxygen (O) is generated, and the PSZ film 35 is allowed to react with oxygen to generating $SiO_2$ and $NH_3$ (ammonia gas). In this manner, the PSZ film 35 can be converted into the $SiO_2$ film 36. Since the element-forming region is covered with the $Si_3N_4$ film 32, the surface of the silicon substrate 30 can be hardly oxidized.

The aforementioned chemical reaction would proceed starting from the surface of the PSZ film 35 where the surface of the STI trench 33 is exposed.

By performing the BOX oxidation for about 30 minutes at a temperature of 800° C., the Si—N bond in the PSZ film 35 can be converted into an Si—O bond. As a result, the PSZ film 35 which has been buried inside the STI trench 33, including the portion of the PSZ film 35 which is disposed at the bottom of the trench 33, can be completely converted into the $SiO_2$ film 36, thus enhancing the conversion efficiency.

In order to further enhance the conversion efficiency of the Si—N bond into the Si—O bond in the BOX oxidation step, a two-stage BOX oxidation may be employed. In this two-stage BOX oxidation, the PSZ film 35 is at first held at a relatively low temperature ranging from 200° C. to 450° C. for 30 to 60 minutes in an atmosphere containing water vapor. If this temperature is lower than 200° C., it may become difficult to sufficiently convert the Si—N bond into the Si—O bond. On the other hand, if this temperature is higher than 450° C., the shrinkage of the PSZ film 35 may be caused to occur. Therefore, a more preferable range of this temperature would be 350° C. to 450° C. Thereafter, with the atmosphere of water vapor being kept as it is, the temperature is raised to the range of 450° C. to 1000° C., more preferably 800° C. or so and the heat treatment at this high temperature is additionally continued for about 30 minutes. If this temperature is lower than 450° C., it would become difficult to sufficiently convert the PSZ film into the $SiO_2$ film. On the other hand, if this temperature is raised above 1000° C., crystal defects may be caused to generate.

This two-stage BOX oxidation method is especially effective in the conversion of the PSZ film into the $SiO_2$ film. It is important in this case to keep the conversion-initiating temperature of PSZ film into $SiO_2$ film (for example, a temperature of about 400° C.) for a predetermined period of time. Because, if the temperature of PSZ film is permitted to continuously rise, the shrinkage of the PSZ film will be caused to occur before the conversion thereof is sufficiently proceeded, thereby preventing the smooth conversion thereof into the $SiO_2$ film. Further, in order to realize an effective conversion of the PSZ film into the $SiO_2$ film, it is desirable to create an atmosphere of water vapor by using a high concentration of vapor to be derived from the burning oxidation of hydrogen.

Figure 6E:
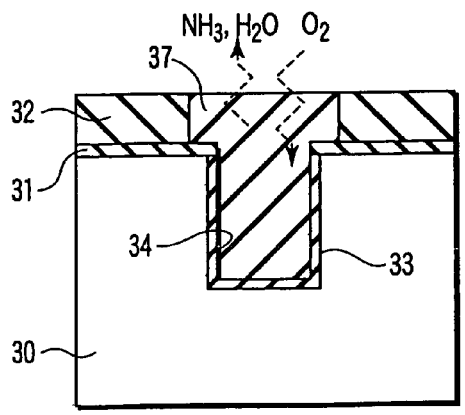

Then, as shown in FIG. 6E, the $SiO_2$ film 36 is subjected to a heat treatment for about 30 minutes at a temperature ranging from 800° C. to 1100° C., for example 900° C. or so, in an oxidizing atmosphere or in an inert gas (such as nitrogen gas) atmosphere. On account of this heat treatment, residual $NH_3$ or $H_2O$ which are contained in the $SiO_2$ film 36 can be released therefrom, thus enhancing the density of the $SiO_2$ film 36. As a result, an $SiO_2$ film 37 which is higher in density as compared with the $SiO_2$ film 36 can be obtained, thereby making it possible to minimize the leak current of the film. If the temperature on this occasion is lower than 800° C., it would be impossible to realize the aforementioned effects. On the other hand, if the temperature on this occasion is higher than 1100° C., crystal defects may be caused to generate in the $SiO_2$ film 37. When an oxygen atmosphere is employed herein, the concentration of impurities such as carbon (C) in the film can be minimized. Additionally, it is possible to minimize not only the leak current but also the fixed electric charge at the interface between the film and the silicon substrate. On the other hand, when an inert gas (such as nitrogen gas) atmosphere is employed herein, the oxidation of the silicon sidewalls in the STI trench 33 can be inhibited. As a result, it is possible to prevent the width of element from decreasing (i.e. to prevent the width of the STI from increasing).

Since the element-forming region is covered with the $Si_3N_4$ film 32 during the densification treatment, the surface of the silicon substrate 30 can be prevented from being oxidized even in an oxidizing atmosphere. The densification treatment of $SiO_2$ film 36 may be performed by using RTA (Rapid Thermal Annealing) or RTO (Rapid Thermal Oxidation) other than the heat treatment using an ordinary furnace. If RTA is employed herein, the heat treatment can be performed at a higher temperature (for example, 950° C.) and requiring a time period of 20 seconds or so.

Figure 6F:
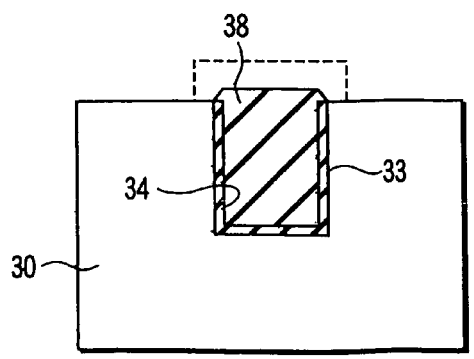

Next, the $Si_3N_4$ film 32 and the $SiO_2$ film 31 are removed to expose the surface of the silicon substrate 30 as shown in FIG. 6F. The $SiO_2$ film 37 can be wet-etched by buffered hydrofluoric acid (buffered HF) at a wet etching rate which is about 1.4 times as high as that of thermally oxidized film. The wet etching rate of the $SiO_2$ film 36 immediately after the BOX oxidation is 2 to 2.5 times as high as that of the thermally oxidized film, so that the wet etching rate of the $SiO_2$ film 37 can be assumed as being reduced in comparison with that of thermally oxidized film. Therefore, there is little possibility that the $SiO_2$ film 37 disposed at an upper portion of the STI trench 33 can be excessively etched on the occasion of removing the $SiO_2$ film 31. As a result, as shown in the drawing, it is possible to obtain an STI structure where an $SiO_2$ film 38 is buried in such a manner that the $SiO_2$ film 38 is slightly protruded from the surface of the silicon substrate 30.

Thereafter, various steps will be taken for accomplishing an MOS transistor, including the formation of sacrificial oxide film; channel ion implantation; the removal of a sacrificial oxide film; the formation of a gate insulating film; the formation of a gate electrode; the formation of source/drain diffusion layers; the formation of an interlayer insulating film; the formation of contacts; the formation of a wiring layer; the formation of a passivation film; the formation of pads; etc.

According to the manufacturing method of semiconductor device which is set forth in this first embodiment, it is possible, through the employment of a PSZ film, to manufacture a semiconductor device having an STI structure which is free from the deterioration of configuration such as divot, and fluctuation of height. In particular, the method according to this embodiment is featured in that the PSZ film disposed on the mask member is removed while selectively leaving the PSZ film in the STI trench, and the distance between the bottom of the STI trench and the top surface of the PSZ film is reduced before converting the PSZ film into an $SiO_2$ film by of BOX oxidation. As a result, it is now possible to completely convert the PSZ film in the STI trench into the $SiO_2$ film even if the STI trench formed in the substrate is as narrow as about 100 nm or less in trench width. Therefore, it is now possible to form, inside the STI trench, an element isolation structure which is minimal in deterioration of configuration.

Furthermore, since the PSZ film is made thinner, the conversion efficiency of the PSZ film placed in the STI trench into an $SiO_2$ film can be enhanced, and at the same time, the densification of the $SiO_2$ film can be promoted. As a result, the etching rate of the $SiO_2$ film relative to that of the thermally oxidized film can be sufficiently reduced. Further, the STI structure of this excellent configuration can be retained even during the repeated steps in a process after the formation of the STI structure, such as a step of oxidizing the surface of a substrate and a step of removing the oxide film, thereby making it possible to realize excellent element isolation. Furthermore, the leak current as well as the fixed electric charge at the bottom of the STI trench can be minimized, thereby improving the product yield.

Second Embodiment

A method of manufacturing a semiconductor device according to a second embodiment will be explained with reference to FIGS. 7A and 7B. This embodiment is substantially the same as the first embodiment except the densification step of $SiO_2$ film. Namely, a sequence of processes starting from the step of forming the STI trench 33 shown in FIG. 6A up to the step of converting the PSZ film into the $SiO_2$ film 36 shown in FIG. 6D are the same as those of the first embodiment. Therefore, only the steps differing from those of the first embodiment will be explained, as follows.

Figure 7A:
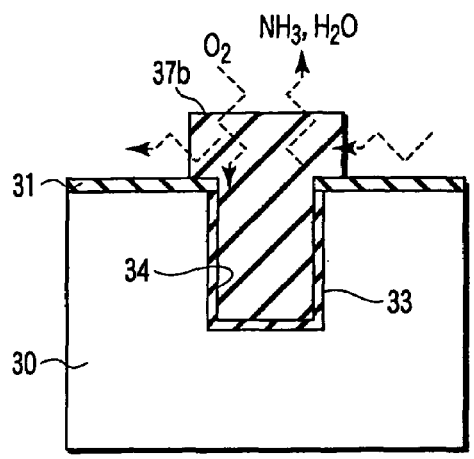
FIGS. 7A and 7B show respectively a cross-sectional view illustrating, stepwise, part of the manufacturing method of semiconductor device according to a second embodiment of the present invention.

In this embodiment, as shown in FIG. 7A, the $Si_3N_4$ film 32 to be employed as a mask member is removed prior to the step of converting the $SiO_2$ film 36 into the densified $SiO_2$ film 37. Namely, a densified $SiO_2$ film 37b is formed through a densifying treatment in an oxidizing atmosphere or in an inert gas atmosphere, which is performed after a step wherein even the sidewalls of the $SiO_2$ film 36 are permitted to expose. Since $NH_3$ or $H_2O$ can be released also from the sidewalls of the $SiO_2$ film 36, the densification of the $SiO_2$ film will be further promoted.

Figure 7B:
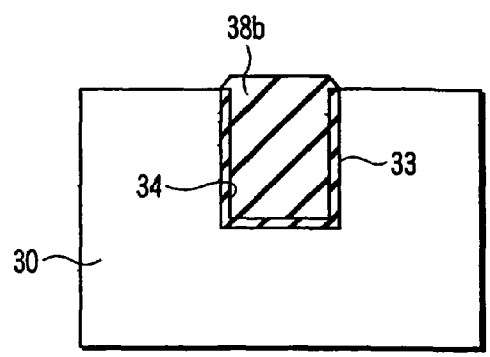

As a result, there is little possibility that the $SiO_2$ film 37b is excessively etched on the occasion of removing the $SiO_2$ film 31, thereby making it possible to obtain a buried STI structure 38b having a desirable configuration, as shown in FIG. 7B.

Even in the manufacturing method of a semiconductor device according to this second embodiment, it is possible, through the employment of a PSZ film, to manufacture a semiconductor device having an STI structure which is buried with an excellent configuration in the STI trench. In particular, the method according to this embodiment is featured in that the PSZ film is converted into an $SiO_2$ film after the PSZ film is made thinner, and that the densification treatment is performed after permitting the sidewalls of the $SiO_2$ film to expose. As a result, it is now possible to promote the densification of the $SiO_2$ film from the regions of sidewalls of the $SiO_2$ film even in a region where the STI trench formed therein is as narrow as about 100 nm or less in trench width. Therefore, it is now possible to form, inside the STI trench, an element isolation structure which is minimal in deterioration of configuration. As a result, the etching rate of the $SiO_2$ film relative to that of the thermally oxidized film can be sufficiently reduced. It is possible in this manner to retain an STI structure of excellent configuration even during a succeeding process after the formation of the STI structure, thereby improving the yield of products.

Although the foregoing explanations are based on embodiments where the PSZ film is employed as a coating type insulating film, it is also possible to employ other coating type film which are capable of transforming into an insulating film through the heat treatment thereof after coating.

Further, it is possible to deposit a dielectric film such as the PSZ film by STP on the surface of a semiconductor substrate provided in advance with an element isolating trench or step portions such as wiring portions. Next, this STP method will be explained with reference to FIGS. 8A to 8D.

Figure 8A:
FIGS. 8A to 8D show respectively a cross-sectional view illustrating, stepwise, the STP method.
Figure 8C:
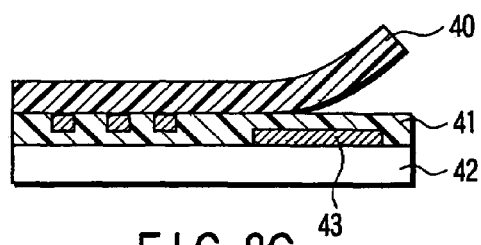
Figure 8B:
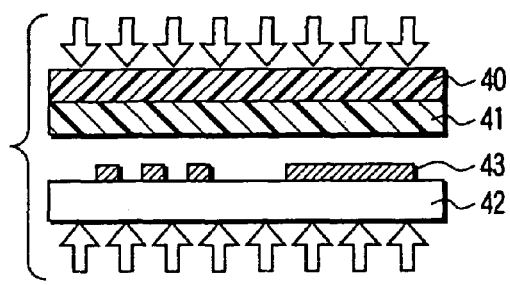
Figure 8D:
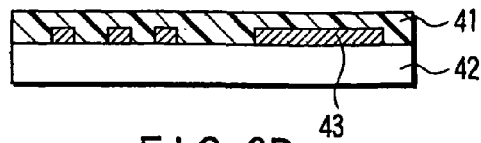

First of all, as shown in FIG. 8A, a dielectric film 41 is peelably coated on the surface of a base film 40. As for the dielectric film 41, it is possible to employ the aforementioned PSZ film for instance. This dielectric film 41 is then adhered, while applying heat and pressure thereto, onto the surface of a silicon substrate 42 provided with a step portion 43 consisting of a wiring element as shown in FIG. 8B. An insulating film (not shown) may be deposited on the surface of the wiring element in such a manner that the step portion 43 may be reflected in this insulating film. Alternatively, the step portion on the silicon substrate 42 may be one which is originated from either an element-isolating trench or electrodes. Thereafter, as shown in FIG. 8C, the base film 40 is peeled away. As a result, it is possible to form the dielectric film 41 covering the step portion 43 while maintaining a flat surface as shown in FIG. 8D. The thickness of the dielectric film 41 over the step portion 43 may be optionally controlled depending on the thickness of the dielectric film to be formed on the base film 40.

Third Embodiment

A method of manufacturing a semiconductor device according to a third embodiment of the present invention will be explained with reference to FIGS. 9A to 9F. These FIGS. illustrate a couple of STI regions, i.e. a narrow STI region 33a having a width of the order of 100 nm or less, which corresponds to the dotted portion shown in FIG. 5, and a wide STI region 33b having an STI width of larger than 100 nm.

Figure 9A:
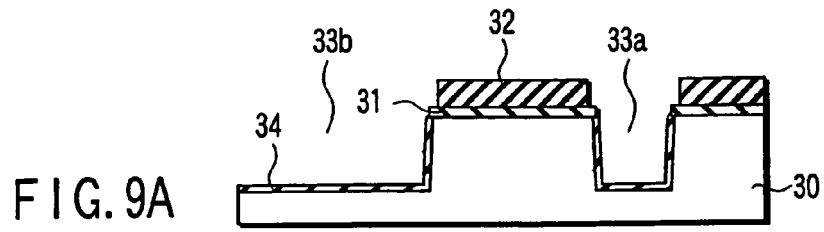
FIGS. 9A to 9F show respectively a cross-sectional view illustrating, stepwise, a manufacturing method of a semiconductor device according to a third embodiment of the present invention.

First of all, as shown in FIG. 9A, an $Si_3N_4$ 32 film functioning as a mask member is deposited on the surface of a semiconductor substrate 30 (for example, a silicon substrate) with an $SiO_2$ film 31 being interposed therebetween. Then, an STI trench 33 is formed in the silicon substrate 30. The film thickness of these films to be formed herein may be controlled by the same manner as already explained with reference to the first embodiment. As for the depth and width of the STI trench 33, they can be selected in the same manner as already explained with reference to the first embodiment.

After the thermally oxidized film 34 is formed on the sidewalls of the STI trenches 33a and 33b in the same manner as explained with reference to the first embodiment, the $Si_3N_4$ film 32 is selectively regressed in lateral direction by a distance of about 10 nm.

Figure 9B:
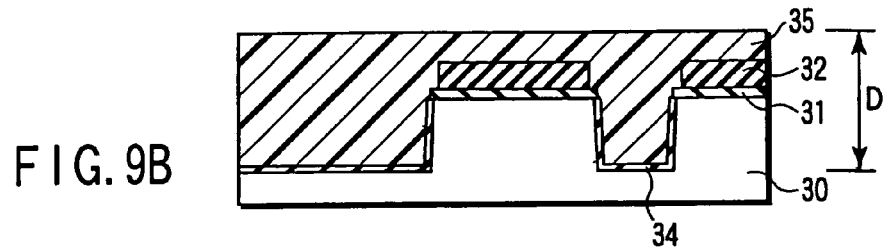

Then, by using STP, the STI trench 33 is filled with a dielectric film 35 so as to form a flat top surface as shown in FIG. 9B. For example, a PSZ film 35 is deposited to a thickness of about 100 nm as measured at a region the $Si_3N_4$ film 32. Incidentally, the PSZ film is preliminarily subjected to baking for about 3 minutes at a temperature of about 150° C. in a coating apparatus to be employed for coating a base film, thereby permitting a solvent contained in the PSZ film to evaporate therefrom.

Since the thickness of the $Si_3N_4$ film 32 is caused to decrease to about 190 nm from the initial deposition thickness of 200 nm, the distance between the surface of the PSZ film 35 and the bottom of the STI trench 33 would become about 590 nm. It has been found that since the burying property of the STP method is excellent, the PSZ film can be buried in a narrow STI trench having a width in the order of 100 nm without generating voids therein. Further, the PSZ film can be concurrently buried in the wide STI trench region so as to form a flat surface.

Since the PSZ film is deposited by STP, the distance "D" between the bottom of the STI trench 33 and the top surface of the PSZ film 35 becomes as short as about 590 nm. Namely, the distance "D" between the bottom of the STI trench 33 and the top surface of the PSZ film 35 would become one which corresponds to the film thickness of the region over the mask in the conventional method. Alternatively, it may be said that the distance "D" would become one which nearly corresponds to the film thickness of the PSZ film 35 existing at a sufficiently wide STI trench width portion.

Figure 9C:
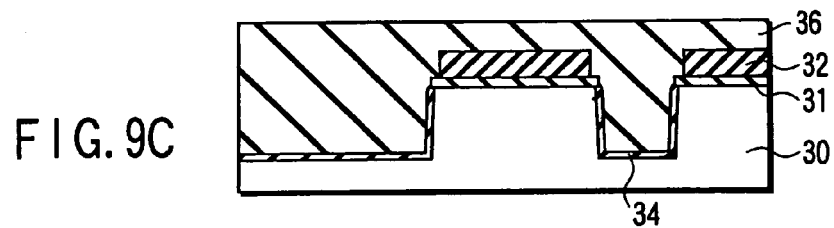

Then, as shown in FIG. 9C, the PSZ film 35 is subjected to the BOX oxidation for about 30 minutes at a temperature of 800° C. in an atmosphere of water vapor, thereby enabling the PSZ film 35 to convert into the $SiO_2$ film 36. The reaction involved herein can be represented by the aforementioned chemical formula (1).

By performing BOX oxidation for about 30 minutes at a temperature of 800° C., the Si—N bond in the PSZ film 35 can be converted into an Si—O bond. As a result, the PSZ film 35 which has been buried inside the STI trench 33, including the portion of the PSZ film 35 which is disposed at the bottom of the trench 33, can be completely converted into the $SiO_2$ film 36.

As already explained, due to the employment of the two-stage BOX oxidation method, the conversion efficiency of the Si—N bond into the Si—O bond can be further enhanced. In this two-stage BOX oxidation, as a first step, the PSZ film 35 is held at a relatively low temperature ranging from 200° C. to 450° C. for 30 to 60 minutes in an atmosphere containing water vapor. A more preferable range of temperature is 350° C. to 450° C. Thereafter, as a second step, with the atmosphere of water vapor being kept as it is, the temperature is risen to the range of 450° C. to 1000° C., more preferably 700° C. to 800° C. and the heat treatment at this high temperature is additionally continued for about 30 minutes. With this heat treatment it is possible to remove impurities such as carbon (C) remaining in the PSZ film.

This two-stage BOX oxidation method is especially effective in the conversion of the PSZ film into the $SiO_2$ film. It is important in this case to keep the conversion-initiating temperature of PSZ film into $SiO_2$ film (for example, a temperature of about 400° C.) for a predetermined period of time. Because, if the temperature of the PSZ rises up to the high temperature side, the shrinkage of the PSZ film will be caused to occur before the conversion thereof is sufficiently proceeded, which prevents smooth conversion thereof into the $SiO_2$ film. Further, in order to realize an effective conversion of the PSZ film into the $SiO_2$ film, it is desirable to create an atmosphere of water vapor by using a high concentration of vapor to be derived from the burning oxidation of hydrogen. The water content in this atmosphere is preferably 80% or more.

Figure 9D:
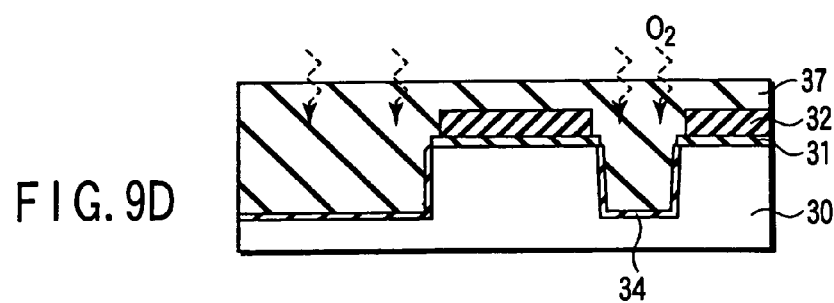

Then, as shown in FIG. 9D, the $SiO_2$ film 36 is subjected to heat treatment for about 30 minutes at a temperature ranging from 800° C. to 1000° C., for example 900° C. or so, in an oxidizing atmosphere or in an inert gas (such as nitrogen gas) atmosphere. On account of this heat treatment, residual $NH_3$ or $H_2O$ which remains in the $SiO_2$ film 36 can be released therefrom, thus enhancing the density of the $SiO_2$ film 36. As a result, an $SiO_2$ film 37 which is higher in density as compared with the $SiO_2$ film 36 can be obtained, thereby making it possible to minimize the leak current of the film. When an oxygen atmosphere is employed herein, the concentration of impurities such as carbon (C) in the film can be further minimized. Additionally, it is possible to minimize not only the leak current but also the fixed electric charge at the interface between the film and the silicon substrate. On the other hand, when an inert gas (such as nitrogen gas) atmosphere is employed herein, the oxidation of the silicon sidewalls in the STI trench 33 can be inhibited. As a result, it is possible to prevent the width of element from decreasing (i.e. to prevent the width of the STI from increasing).

Since the element-forming region is covered with the $Si_3N_4$ film 32 during the densification treatment, the surface of the silicon substrate 30 can be prevented from being oxidized even in an oxidizing atmosphere. As already explained above, the densification treatment of $SiO_2$ film 36 may be performed by using RTA or RTO.

Figure 9E:
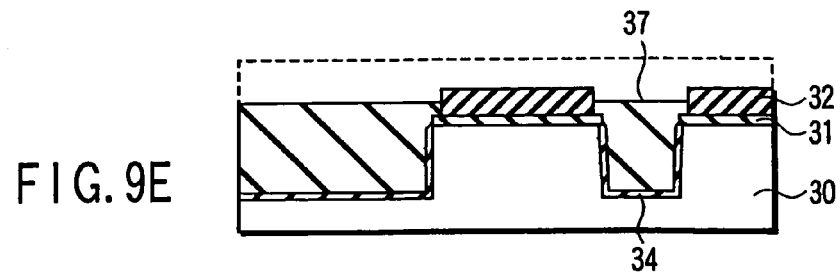

Further, in order to adjust the height of the STI, the $SiO_2$ film is back-etched to form the $SiO_2$ film 37 in the STI trench as shown in FIG. 9E. This back-etching can be performed by using dry etching, wet etching or a combination of the whole-surface CMP and wet etching. The height of the STI can be determined depending on the number of wet etching to be performed in subsequent steps. For example, the height of the STI can be adjusted by controlling the number of etching steps such as the etching of the $SiO_2$ film 32, and the etching of the sacrificial oxide film on the occasion of channel ion implantation. In this embodiment, the height of the STI is adjusted such that the height of the top surface of the $SiO_2$ film 37 becomes about 40 nm as measured from the surface of the silicon substrate 30.

Figure 9F:
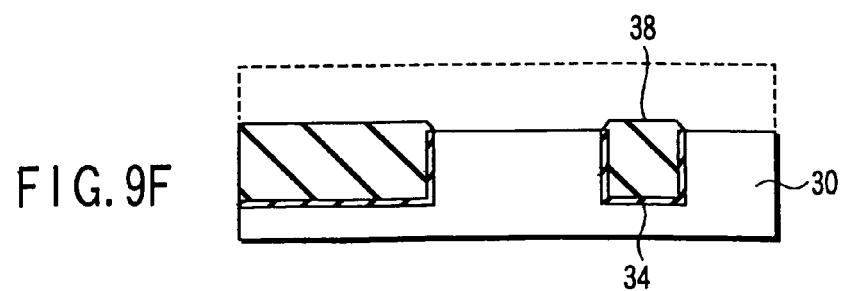

Next, the $Si_3N_4$ film 32 and the $SiO_2$ film 31 are removed to expose the surface of the silicon substrate 30 as shown in FIG. 9F. The $SiO_2$ film 37 can be wet-etched by buffered hydrofluoric acid (buffered HF) at a wet etching rate which is about 1.4 times as high as that of thermally oxidized film. The wet etching rate of the SiO₂ film 36 immediately after the BOX oxidation is 2 to 2.5 times as high as that of the thermally oxidized film, so that the wet etching rate of the SiO₂ film 37 can be assumed as being reduced in comparison with that of thermally oxidized film. Therefore, there is little possibility that the SiO₂ film 37 disposed at an upper portion of the STI trench 33 will be excessively etched on the occasion of removing the SiO₂ film 31. As a result, as shown in the drawing, it is possible to obtain an STI structure where an SiO₂ film 38 is buried in such a manner that the SiO₂ film 38 is slightly protruded from the surface of the silicon substrate 30.

Thereafter, various steps are carried out for forming an MOS transistor, including: the formation of a sacrificial oxide film; channel ion implantation; the removal of a sacrificial oxide film; the formation of a gate insulating film; the formation of a gate electrode; the formation of source/drain diffusion layers; the formation of an interlayer insulating film; the formation of contacts; the formation of a wiring layer; the formation of a passivation film; the formation of pads; etc.

According to the manufacturing method of the semiconductor device set forth in this third embodiment, it is possible, through the employment of a PSZ film, to manufacture a semiconductor device having an STI structure which is free from the deterioration in configuration, such as divots, and fluctuation of height. In particular, not only in the case of a wide trench having an STI width of 1 µm or more, but also in the case of a narrow trench having an STI width of about 100 nm or less, the PSZ film can be uniformly and thinly formed all over the surface of the wafer, including these trenches. As a result, the PSZ film formed inside the STI trench can be completely converted into the SiO₂ film. Therefore, it is possible, irrespective of the magnitude of STI trench width, to form an element isolation structure which is free from any deterioration in configuration in the STI trench.

Furthermore, since the PSZ film is made thinner, the conversion efficiency of the PSZ film placed in the STI trench into an SiO₂ film can be enhanced, and at the same time, the densification of the SiO₂ film can be promoted. As a result, the etching rate of the SiO₂ film relative to that of the thermally oxidized film can be sufficiently reduced. Further, the STI structure of this excellent configuration can be retained even during the repeated steps in a process after the formation of the STI structure, such as a step of oxidizing the surface of a substrate and a step of removing the oxide film, thereby making it possible to realize excellent element isolation. Furthermore, the leak current as well as the fixed electric charge at the bottom of the STI trench can be minimized, thereby improving the product yield.

Fourth Embodiment

A method of manufacturing a semiconductor device according to a fourth embodiment will be explained with reference to FIGS. 10A and 10B. This embodiment is substantially the same as the aforementioned third embodiment except the densification step of the SiO₂ film. Namely, a sequence of processes starting from the step of forming the STI trench 33 shown in FIG. 9A up to the step of converting the PSZ film into the SiO₂ film 36 shown in FIG. 9C are the same as those of the third embodiment. Therefore, only the steps differing from those of the third embodiment will be explained, as follows.

In this embodiment, as shown in FIG. 10A, the Si₃N₄ film 32 to be employed as a mask member is removed prior to the step of converting the SiO₂ film 36 into the densified SiO₂ film 37. Namely, a densified SiO₂ film 37b is formed through a densifying treatment in an oxidizing atmosphere or in an inert gas atmosphere, which is performed after a step wherein even the sidewalls of the SiO₂ film 36 are permitted to expose. Since NH₃ or H₂O can be released also from the sidewalls of the SiO₂ film 36, the densification of the SiO₂ film will be further promoted.

As a result, there is little possibility that the SiO₂ film 37b will be excessively etched off on the occasion of removing the SiO₂ film 31, thereby making it possible to obtain a buried STI structure 38b having a desirable configuration as shown in FIG. 10B.

Even in the manufacturing method of a semiconductor device according to this fourth embodiment, it is possible, through the employment of a PSZ film, to manufacture semiconductor device having an STI structure which is buried with an excellent configuration in the STI trench. In particular, the method according to this embodiment is featured in that the PSZ film is converted into an SiO₂ film after the PSZ film is made thinner, and that the densification treatment is performed after permitting the sidewalls of the SiO₂ film to expose. As a result, it is now possible to promote the densification of the SiO₂ film from the regions of sidewalls of the SiO₂ film even in a region where the STI trench formed therein is as narrow as about 100 nm or less in trench width. Therefore, it is now possible to form, inside the STI trench, an element isolation structure which is minimal in deterioration of configuration. As a result, the etching rate of the SiO₂ film relative to that of the thermally oxidized film can be sufficiently reduced. It is possible in this manner to retain an STI structure of excellent configuration even during a succeeding process after the formation of the STI structure, thereby improving the product yield.

Fifth Embodiment

A method of manufacturing a semiconductor device according to a fifth embodiment of the present invention will be explained with reference to FIGS. 11A to 11G. This embodiment illustrates a method of forming a PMD (Pre-Metal Dielectric) structure.

First of all, as shown in FIG. 11A, a gate electrode 52 is formed on the surface of a silicon substrate 51, and then covered with an interlayer insulating film 53 consisting of an SiO₂ film or an Si₃N₄ 32 film. The surface of the interlayer insulating film 53 is featured as having a step portion originated from the provision of the gate electrode 52.

Then, as shown in FIG. 11B, by STP, a dielectric film 54 is formed on the surface of the interlayer insulating film 53 having this step portion. As a result, the step portion originated from the gate electrode 52 is buried by the dielectric film 54 having a flat surface.

Incidentally, if there is no problem even if the surface of dielectric film 54P is accompanied with some degree of step portion as shown in FIG. 11C, the dielectric film 54P may be formed by a coating method.

If the dielectric film 54 is to be formed by using the STP method, a PSZ film functioning as the dielectric film 54 is deposited to a thickness of about 200 nm, for example, as measured at a region over the interlayer insulating film 53 formed on the gate electrode 52. Incidentally, the PSZ film is preliminarily subjected to baking for about 3 minutes at a temperature of about 150° C. in a coating apparatus to be employed for coating a base film, thereby permitting a solvent contained in the PSZ film to evaporate therefrom.

The step portion to be generated on the surface of the interlayer insulating film 53 due to the provision of the gate electrode 52 would be at least 300 nm or so even if the coverage of the interlayer insulating film 53 is taken into account. Therefore, the distance between the surface of the dielectric film 54 and the surface of the interlayer insulating film 53 is around 500 nm at most. It has been found that since the burying property of the STP method is excellent, the PSZ film can be buried in a narrow STI trench having a width in the order of 100 nm without generating voids therein. Since the PSZ film is deposited by the STP method, the maximum distance between the surface of the interlayer insulating film 53 and the surface of the dielectric film 54 becomes as short as about 500 nm. Namely, the PSZ film can be formed sufficiently thin.

Then, as shown in FIG. 11D, the PSZ film 54 is subjected to the BOX oxidation for about 30 minutes at a temperature of 600° C. in an atmosphere of water vapor, thereby enabling the PSZ film 54 having a thickness of about 500 nm to convert into an $SiO_2$ film 55. The reaction involved herein can be represented by the aforementioned chemical formula (1). However, it is preferable that this heat treatment is performed at a sufficiently low temperature (600° C.) so as to prevent the gate electrode disposed below the interlayer insulating film 53 from being oxidized.

By performing the BOX oxidation for about 30 minutes at a temperature of 600° C., the Si—N bond in the PSZ film 54 can be converted into an Si—O bond. As a result, the PSZ film 54 which has been buried inside the step portion originated from the provision of the gate electrode can be completely converted into the $SiO_2$ film 55.

As already explained, due to the employment of the two-stage BOX oxidation method, the conversion efficiency of the Si—N bond into the Si—O bond can be further enhanced. In this two-stage BOX oxidation, first of all, the PSZ film is held at a relatively low temperature ranging from 200° C. to 450° C. for 30 to 60 minutes in an atmosphere containing water vapor. A more preferable range of temperature is 350° C. to 450° C. Thereafter, with the atmosphere of water vapor being kept as it is, the temperature is raised to the range of 500° C. to 600° C., and the heat treatment at this high temperature is additionally continued for about 30 minutes. It is possible with this heat treatment to remove impurities such as carbon (C) or nitrogen (N) remaining in the PSZ film. The concentration of water content in this atmosphere should preferably be 80% or more.

As a result of the two-stage BOX oxidation of the PSZ film 54, the conversion of the PSZ film 54 into the $SiO_2$ film 55 can be smoothly proceeded. The wet etching rate of the $SiO_2$ film 55 formed as described above would become about twice as large as that of the thermally oxidized film. Incidentally, the wet etching rate of a plasma $SiO_2$ film which has been formed at low temperatures is about four times as large as that of the thermally oxidized film. Therefore, the wet etching rate of the $SiO_2$ film 55 relative to the thermally oxidized film would become as low as about a half the wet etching rate of the plasma $SiO_2$ film.

Then, as shown in FIG. 11E, a plasma $Si_3N_4$ film 56 excellent in moisture resistance is deposited to a thickness of about 200 nm. Since the $SiO_2$ film 55 to be employed as an underlying layer is formed flat by the STP method, it is possible to form a uniform and thin plasma $Si_3N_4$ film 56.

Furthermore, by lithography and RIE, a contact hole 57 is formed as shown in FIG. 11F.

Thereafter, as shown in FIG. 11G, a wiring layer 58 and an interlayer insulating film 59 are formed. Since it is possible to suppress the generation of abnormal etching on the sidewalls of the contact hole even in a pre-treatment (wet etching treatment) in the formation of the wiring layer for the contact, it is possible to form a contact of excellent configuration.

It is possible, with the employment of the manufacturing method of a semiconductor device according to the fifth embodiment where the PSZ film is employed, to form a flat interlayer insulating film useful for the PMD by a step of low temperatures of not higher than 600° C. without necessitating the employment of CMP. Further, it is possible to form an interlayer insulating film which is free from deterioration in configuration of contact.

Sixth Embodiment

A method of manufacturing a semiconductor device according to a sixth embodiment of the present invention will be explained with reference to FIGS. 12A to 12E. This embodiment illustrates a method of forming a passivation film structure which is excellent in flatness.

First of all, as shown in FIG. 12A, a metal wiring layer 62 is formed on the surface of an interlayer insulating film 61, and then a P—$SiO_2$ film 63 is formed on the metal wiring layer 62. This embodiment will be explained by referring to the metal wiring layer 62 which is made of aluminum (Al).

Then, as shown in FIG. 12B, by STP, a dielectric film 64 is formed on the surface of the P—$SiO_2$ film 63 having a step portion originated from the metal wiring layer 62. As a result, the step portion originated from the metal wiring layer 62 is buried by the dielectric film 64, thereby obtaining a flat surface.

Incidentally, if there is no problem even if the surface of the dielectric film 64 is accompanied with some degree of step portion, the dielectric film 64 may be formed by a coating method.

If the dielectric film 64 is to be formed by using the STP method, a PSZ film functioning as the dielectric film 64 is deposited to a thickness of about 100 nm to 200 nm, for example, as measured at a region over the interlayer insulating film 61 formed on the metal wiring layer 62. Incidentally, the PSZ film is preliminarily subjected to baking for about 3 minutes at a temperature of about 150° C. in a coating apparatus to be employed for coating a base film, thereby permitting a solvent contained in the PSZ film to evaporate therefrom.

The step portion originated from the metal wiring layer 62 would be at least 1 μm or so even if the coverage of the interlayer insulating film 61 is taken into account. Therefore, the distance between the surface of the PSZ film 64 and the surface of the plasma $SiO_2$ film 63 would be at least about 200 nm and at most about 1200 nm. It has been found that since the burying property of the STP method is excellent, the PSZ film can be buried in a narrow trench having a width in the order of 100 nm without generating voids therein. It is possible, through the employment of the STP method, to concurrently achieve the film-forming and flattening of the PSZ film 64.

Then, as shown in FIG. 12C, it is possible, through the BOX oxidation of about 60 minutes at a temperature of 400° C. and in an atmosphere of water vapor, to convert the PSZ film 64 having a thickness of about 1 μm into the $SiO_2$ film 65.

On the occasion of this BOX oxidation, the surface of the underlying wiring layer 62 may be slightly oxidized. Especially when the wiring layer 62 is made of Al, oxygen may reach the surface of the wiring layer 62 through the plasma $SiO_2$ film 63 as the wiring layer 62 is heat-treated at a temperature of 350° C. or more in an atmosphere of water vapor. As a result, an alumina ($Al_2O_3$) film 66 having a film thickness of about 5 nm may be formed on the surface of the Al wiring layer. The alumina film 66 formed in this manner is excellent in uniformity and formed so as to cover the circumference of the wiring layer 62. Therefore, the reliability of the metal wiring layer 62 can be considerably improved.

In this embodiment, the BOX oxidation of the PSZ film can be performed by keeping the film for 30 to 60 minutes in an atmosphere containing water vapor at a temperature ranging from 200° C. to 400° C. Through this BOX oxidation, the Si—N bond of the PSZ film 64 can be converted into the Si—O bond. It is possible, through this oxidation treatment in an atmosphere of water vapor, to remove impurities such as carbon (C) or nitrogen (N) remaining in the PSZ film. The concentration of water content in this atmosphere should preferably be 80% or more.

As a result of the BOX oxidation of the PSZ film 64 at a temperature of about 400° C., the conversion of the PSZ film 64 into the $SiO_2$ film 65 can be smoothly proceeded. The wet etching rate of the $SiO_2$ film 65 formed as described above would become about 2.5 times as large as that of the thermally oxidized film. Incidentally, the wet etching rate of the conventional plasma $SiO_2$ film useful for passivation is about five times as large as that of the thermally oxidized film. Therefore, the wet etching rate of the $SiO_2$ film 65 relative to the thermally oxidized film would become as low as about half the wet etching rate of the plasma $SiO_2$ film.

Subsequently, the $SiO_2$ film 65 may be subjected to annealing treatment for about 30 minutes in a nitrogen atmosphere at a temperature of 400° C., thereby removing water from the $SiO_2$ film 65.

Then, as shown in FIG. 12D, a plasma $Si_3N_4$ film 67 exhibiting a low moisture permeability is deposited to a thickness of about 200 nm. Since the $SiO_2$ film 65 to be employed as an underlying layer is formed flat by STP, it is possible to form a uniform and thin plasma $Si_3N_4$ film 67. Since the underlying layer is flat, it is possible to employ a sputtering method for the formation of an SiN film. As a result, the damage of film due to the effects of plasma can be minimized.

Furthermore, by lithography and RIE, a via-hole 68 is formed as shown in FIG. 12E. Thereafter, the via-hole 68 is filled with a conductive material according to the conventional method to form a via and a wiring layer, thereby accomplishing a semiconductor device.

According to this embodiment, since the surface of $SiO_2$ film 65 to be obtained herein is excellent in flatness, a uniform and thin plasma $Si_3N_4$ film 67 can be formed on this $SiO_2$ film 65. As a result, it is possible to prevent the deterioration of reliability that may be caused due to an abnormal distribution of stress by the $Si_3N_4$ film. Further, since the plasma $Si_3N_4$ film which is capable of preventing the permeation of water can be stably formed, the reliability of the device can be improved. In particular, when an Al wiring layer is employed, an alumina film can be formed around the Al wiring layer, thereby making it possible to prominently enhance the reliability of wirings.

The present invention should not be construed as being limited to the aforementioned embodiments. Namely, the embodiments mentioned above may be variously modified and practiced within the spirit of the present invention.

As explained above, according to one embodiment of the present invention, it is possible to provide a method of manufacturing a semiconductor device, which is capable of minimizing, irrespective of the size of the trench width, the deterioration in configuration of the element isolation structure that may be caused by the divot or fluctuation in height of an insulating film to be buried inside the element isolation trench. Further, according to another embodiment of the present invention, it is possible to provide a method of manufacturing a semiconductor device, which is capable of forming, at low temperatures and with excellent flatness, a PMD film exhibiting a wet etching rate which is comparable to an oxide film. Furthermore, according to a further embodiment of the present invention, it is possible to provide a method of manufacturing a semiconductor device, which is capable of forming a passivation film which is excellent in coverage and free from plasma damage.

It is possible with the employment of the present invention to improve the yield of LSI products, and therefore, the present invention is valuable, from an industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming an element isolation trench in a semiconductor substrate by using a mask member located above the semiconductor substrate and having a trench pattern;
   disposing a polysilazane film in the element isolation trench and on the mask member, the polysilazane film being formed by evaporating a solvent from a coating film containing the solvent and silazane perhydrogenated polymer;
   subjecting the polysilazane film to a first heat treatment at a first temperature in an atmosphere containing water vapor; and
   subsequent to the first heat treatment, subjecting the polysilazane film to a second heat treatment at a second temperature higher than the first temperature in an atmosphere containing water vapor, thereby the polysilazane film being adapted to be converted into a silicon oxide film.

2. The method according to claim 1, further comprising after the second heat treatment, subjecting the silicon oxide film to a densifying treatment at a temperature ranging from 800° C. to 1100° C. in an oxidizing atmosphere.

3. The method according to claim 1, further comprising after the second heat treatment, subjecting the silicon oxide film to a densifying treatment at a temperature ranging from 800° C. to 1100° C. in an inert gas atmosphere.

4. The method according to claim 1, wherein the polysilazane film is buried in the element isolation trench in a manner that a distance between a bottom of the element isolation trench and a surface of the polysilazane film is limited to 600 nm or less.

5. The method according to claim 1, wherein the first temperature is in a range from 200° C. to 450° C. and the second temperature is in a range from 450° C. to 1000° C.

6. The method according to claim 1, further comprising after the first heat treatment, removing the polysilazane film disposed on the mask member by CMP to expose a surface of the mask member, thereby selectively leaving the polysilazane film in the element isolation trench.

7. The method according to claim 1, wherein the polysilazane film has a flat surface.

8. The method according to claim 7, wherein the flat surface has a distance of less than 600 nm from a bottom of the element isolation trench.

9. The method according to claim 7, wherein the first temperature is in a range from 200° C. to 450° C. and the second temperature is in a range from 450° C. to 1000° C.

10. The method according to claim 1, further comprising expanding a width of the trench pattern of the mask member after forming the element isolation trench and before disposing the polysilazane film on the semiconductor substrate.

11. The method according to claim 10, wherein expanding of the width is performed by isotropic etching.

12. The method according to claim 1, further comprising back-etching the silicon oxide film to lower a height of a surface of the silicon oxide film.

13. The method according to claim 12, wherein back-etching of the silicon oxide film is performed by using dry etching, wet etching or a combination of CMP and one of these.

14. The method according to claim 1, wherein the coating film is formed on a base film and the polysilazane film is peelably formed on the base film and is transcribed to the semiconductor substrate.

15. The method according to claim 14, wherein forming of the polysilazane film on the semiconductor substrate is performed by locating the polysilazane film on the semiconductor substrate, applying heat and pressure thereto, and peeling the base film.

16. The method according to claim 1, further comprising forming an oxide film on a bottom and side surface of the element isolation trench before disposing the polysilazane film.

17. The method according to claim 16, further comprising after the second heat treatment, subjecting the silicon oxide film to a densifying treatment at a temperature in a range from 800° C. to 1100° C. in an oxidizing atmosphere.

18. The method according to claim 16, further comprising after the second heat treatment, subjecting the silicon oxide film to a densifying treatment at a temperature in a range from 800° C. to 1100° C. in an inert gas atmosphere.

19. The method according to claim 16, further comprising removing the polysilazane film disposed on the mask member by CMP to expose a surface of the mask member, thereby selectively leaving the polysilazane film in the element isolation trench.

* * * * *